United States Patent
Nguyen

[11] Patent Number: 5,214,317
[45] Date of Patent: May 25, 1993

[54] CMOS TO ECL TRANSLATOR WITH INCORPORATED LATCH

[75] Inventor: Thai M. Nguyen, Santa Clara, Calif.

[73] Assignee: National Semiconductor Corporation, Santa Clara, Calif.

[21] Appl. No.: 878,134

[22] Filed: May 4, 1992

[51] Int. Cl.[5] .................. H03K 3/286; H03K 19/0175
[52] U.S. Cl. .................................... 307/291; 307/279; 307/289; 307/446; 307/448; 307/475
[58] Field of Search ................. 307/272.1, 279, 289, 307/290, 291, 355, 446, 448, 455, 475, 530, 570

[56] References Cited

U.S. PATENT DOCUMENTS

| | | | |
|---|---|---|---|
| 4,112,296 | 9/1978 | Heimbigner et al. | 307/279 |
| 4,333,020 | 6/1982 | Maeder | 307/291 |
| 4,370,573 | 1/1983 | Keene | 307/514 |
| 4,504,929 | 5/1985 | Takemae et al. | 365/210 |
| 4,601,017 | 7/1986 | Mochizuki et al. | 365/189 |
| 4,653,029 | 3/1987 | Sato | 365/205 |
| 4,897,567 | 1/1990 | Bacrania | 307/475 |
| 5,023,475 | 6/1991 | Ducourant | 307/272.26 |

FOREIGN PATENT DOCUMENTS

| | | | |
|---|---|---|---|
| 029051 | 1/1987 | European Pat. Off. | 307/291 |
| 0118959 | 10/1978 | Japan | 307/291 |

Primary Examiner—William L. Sikes
Assistant Examiner—T. Cunningham
Attorney, Agent, or Firm—Townsend & Townsend Khourie and Crew

[57] ABSTRACT

An electrical circuit is disclosed which implements a CMOS to ECL translator with an incorporated latch. The invention provides a circuit which uses a small number of devices, and provides fast transition times with low power consumption.

7 Claims, 3 Drawing Sheets

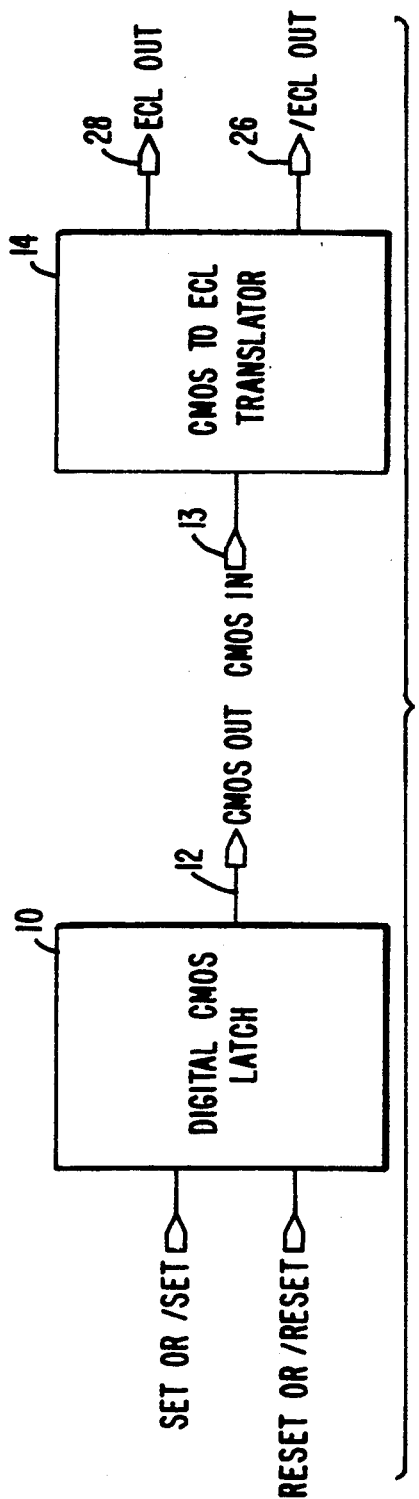
FIG. 1. PRIOR ART
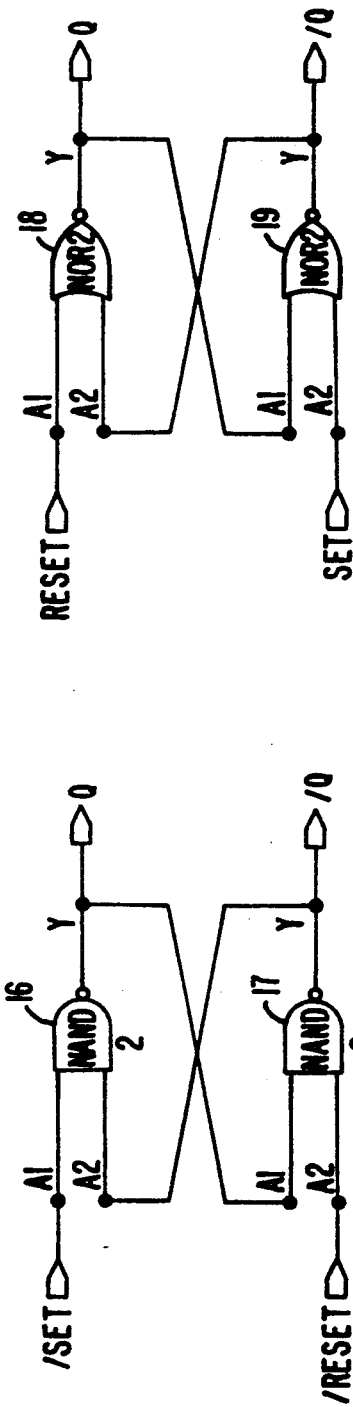
FIG. 2B. PRIOR ART
FIG. 2A. PRIOR ART

CMOS TO ECL TRANSLATOR WITH INCORPORATED LATCH

FIELD OF THE INVENTION

The present invention relates generally to electrical circuits and specifically to an electrical translator circuit for converting complementary metal oxide (CMOS) level signals to emitter coupled logic (ECL) level signals.

BACKGROUND OF THE INVENTION

CMOS and ECL represent two logic families in use today. Each logic family is used by manufacturers of silicone chips to produce integrated circuit devices incorporating transistors or other components of a specific logic family. However, since CMOS and ECL logic families have different electrical characteristics, they cannot be readily connected to one another.

For example, a device incorporating the CMOS logic family will typically have 0 quiescent power consumption and a wide supply range voltage between 3 to 12 V. The output of the CMOS logic family swings rail-to-rail, and the inputs draw little current. A CMOS device is also characterized by a slower switching speed and typically operates at low frequency. On the other hand, an ECL circuit operates at high speed and uses a negative power supply with closely spaced voltage level swings of about $-0.9$ V to $-1.75$ V. It is often desirable to combine both families within a single circuit to take advantage of the characteristics of each logic family. However, because of their different signal characteristics, an ECL device may not be connected directly to a CMOS device and vice versa.

The prior art solves this problem by providing a CMOS to ECL translator when a CMOS device is desired to drive an ECL device. Also, an ECL to CMOS translator will be used when an ECL device is needed to drive a CMOS device. These translators serve to match the current and voltage characteristics of one logic family to the other. However, the design of these translators involves extra components either added to the discrete circuit or incorporated onto the silicon chip embodying the circuit. This adds to the cost, size, power requirements and complexity of the circuit.

SUMMARY OF THE INVENTION

The present invention achieves a CMOS to ECL translator with the incorporated latch on a single chip by using metal oxide semiconductor transistors and bipolar transistors on a single substrate. By minimizing the number of devices on the substrate, the present invention reduces propagation delay time and minimizes power consumption while still maintaining functionality. The present invention combines both a latch and a CMOS to ECL translator on a single substrate of an integrated circuit.

BRIEF DESCRIPTION OF THE DRAWINGS

FIG. 1 is a block level diagram of a prior art digital CMOS latch and a prior art CMOS to ECL translator.

FIG. 2A is a gate level diagram of a prior art latch using NAND gates.

FIG. 2B is a gate level diagram of a prior art latch using NOR gates.

DESCRIPTION OF THE PREFERRED EMBODIMENT

Figure 3:
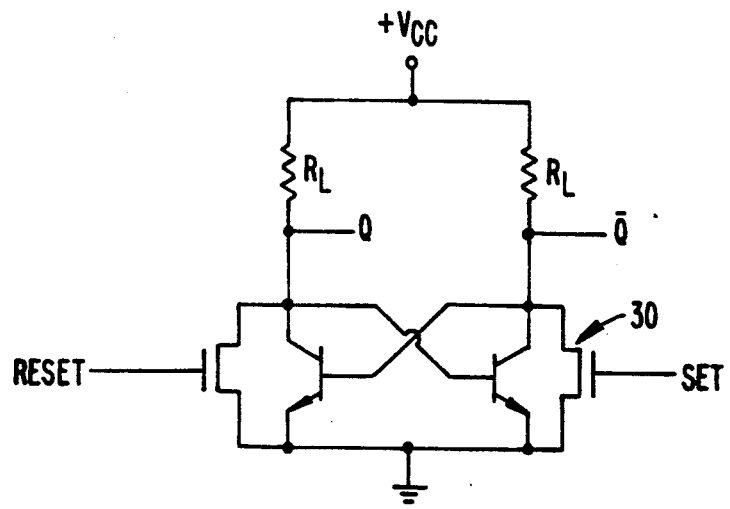
FIG. 3 is a schematic of a prior art latch.

FIG. 1 shows a conceptual representation of a prior art translator circuit. In FIG. 1, the incoming CMOS signal is first latched by the CMOS latch 10. The latch output, or CMOS level signal 12, is then input into the translator circuit 14 at CMOS level input 13 which translates the CMOS level signal to an ECL voltage level. Thus, two discrete circuit components are necessary in the prior art device.

FIGS. 2A and 2B are schematic diagrams of prior art digital CMOS latches. In the device of FIG. 2A, the latch is implemented using NAND gates 16 and 17 cross coupled as shown. In the latch of FIG. 2B, the latch is implemented using NOR gates 18 and 19.

Figure 4:
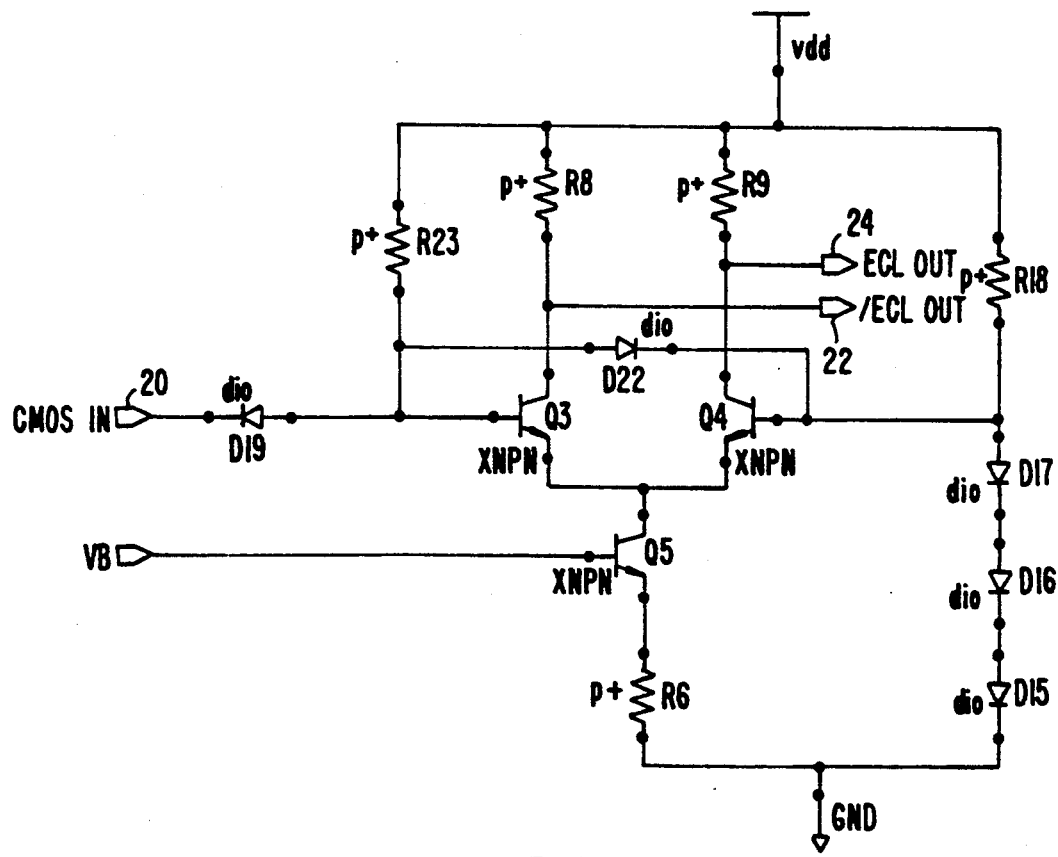
FIG. 4 is a schematic of a prior art CMOS to ECL translator.

One circuit for implementing the latch of FIG. 2B is depicted in FIG. 3. FIG. 3 shows a resistor transistor logic (RTL) circuit. In this circuit, the SET signal is applied to transistor 30. FIG. 4 is a schematic of a prior art translator circuit. In FIG. 4, a CMOS input is applied at pad 20, corresponding to the CMOS level input 13 of FIG. 1. In FIG. 4, outputs 22 and 24 correspond to the outputs of CMOS to ECL translator 14 of FIG. 1, 26 and 28, respectively.

Figure 5:
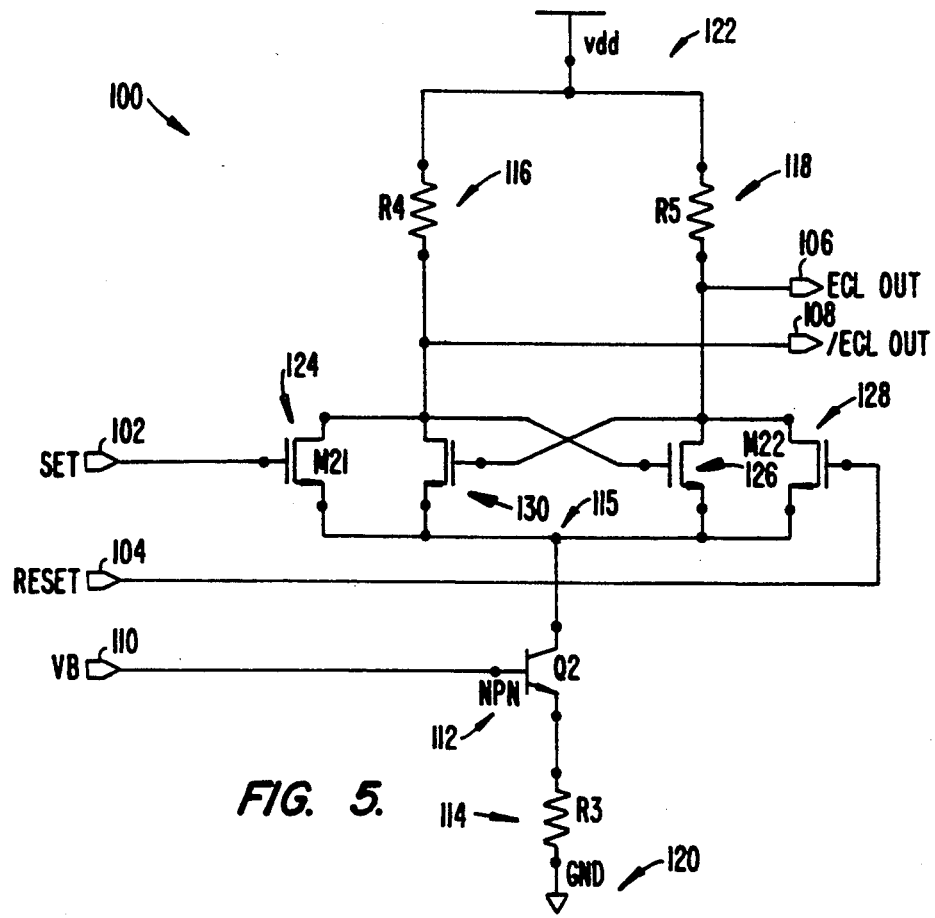
FIG. 5 is a schematic of the CMOS to ECL translator with incorporated latch circuit of the present invention in a first embodiment.

In FIG. 5, an illustration of a circuit of a preferred embodiment of the present invention is shown. The circuit of FIG. 5 incorporates both the functions of the latch of FIG. 2A or FIG. 2B and the CMOS to ECL translator of FIG. 1. The circuit 100 of FIG. 5 is fabricated on a single silicon substrate.

In FIG. 5, a SET signal is applied to pad 102 of circuit 100 and a RESET signal is applied to pad 104. The SET and RESET signals correspond to the SET and RESET signals of FIG. 2B. These signals are the familiar inputs to the traditional SET/RESET or "SR" type of latch. The behavior of an SR latch is well known. That is, with both the SET and RESET signals low, a high logic level (a "1") momentarily applied to the SET input will cause the output of the latch ("Q") of FIG. 2B, (corresponding to pad 106 of FIG. 5) to output a high logic level. A momentary logic high at the RESET signal, on the other hand, will cause the output of the latch to go low. The second output of the latch, pad 108 of FIG. 5, (or "/Q" in FIG. 2B) is the complement of the signal at pad 106 so that when the output at pad 106 is high, the output at pad 108 will be low. Also, when the output at pad 106 is low, the output at pad 108 will be high. The SET and RESET signals are CMOS logic level signals, while the output signals at pads 106 and 108, labeled ECL_OUT and /ECL_OUT, respectively, are ECL voltage level signals.

Next, the operation of the circuit of FIG. 5 will be explained in detail.

In FIG. 5, input pad 110, transistor 112 and resistor 114 comprise a constant current source connected to node 115. The signal VB at pad 110 is a constant reference voltage. Transistor 112 and resistor 114 have values so as to maintain a constant current source in accordance with the description of the circuit as explained below. Specifically, the constant current source is designed so that the current causes a voltage drop of about 800 mV across each of the resistors 116 and 118 as will be described below.

As previously mentioned, signals SET and RESET are CMOS level voltage signals. In the preferred embodiment, the CMOS logic levels vary from a logic low of 0 V to a logic high of 5 V. Accordingly, the ground level potential 120 of circuit 100 is reference 0 V while the voltage source, $V_{DD}$ 122 is a 5 V reference or supply voltage. The application of a high logic level to the SET input while the RESET input is low will cause the output signal, ECL_OUT 106, to be high. ECL_OUT will remain high even when the SET signal returns to a logic low. Similarly, an application of a high logic level of the RESET input will cause the ECL_OUT signal to go low. The ECL_OUT signal will thereafter remain low, even after the RESET signal is returned to zero as long as the SET signal is not applied with a high logic level. As mentioned, /ECL_OUT is the complement of the ECL_OUT signal, that is, /ECL_OUT is high when the ECL_OUT signal is low and the /ECL_OUT signal is low when the ECL_OUT signal is high. In a preferred embodiment of circuit 100, the ECL logic signals swing by 800 mV, that is, the differential voltage between the high and low ECL voltages is 0.8 V. The specific range of the ECL voltages is selected by establishing the upper and lower bounds of the 800 mV differential swing. This is done by choosing particular characteristics for the transistors, resistors and voltages used in the circuit.

Referring to FIG. 5, when a high logic level is applied to the SET input signal, the NMOS transistor 124 is turned on. This causes NMOS transistor 124 to conduct. Since the voltage drop across NMOS transistor in its conducting state is small, the voltage drop across resistor 116 will be the current through node 115 multiplied by the value of resistor 116. In a preferred embodiment, the resistor value 116 is 5000 ohms and the current source comprised of the reference voltage VB applied to pad 110, the transistor 112, and the resistor 114, sinks a current of 0.16 mA. This causes a 0.8 V drop across resistor 116. Thus, the voltage at pad 108 corresponding to ECL_OUT is 5 V minus 0.8 V which equals 4.2 V.

Since NMOS transistor 124 is conducting, the gate-to-source voltage of NMOS transistor 126 is approximately 200 mV which is smaller than the turn-on voltage of NMOS transistors and no current flows from the drain to the source in transistor 126. Thus, transistor 126 is in a cutoff stage.

The RESET signal 104 will be low when SET is high so that NMOS transistor 128 will be off also. Thus, the base of bipolar transistor 130 will be pulled high through resistor 118 which is connected to $V_{DD}$ and, thus, transistor 130 will be on. However, transistor 130 is merely providing a parallel current path with NMOS transistor 124 which is also on. Thus, transistor 130 has no appreciable additional effect at this point. Since the input impedance into the gate of transistor 130 is very high, there will be no appreciable current flowing through resistor 118. This means that the voltage at pad 106, i.e., signal ECL_OUT, will be essentially $V_{DD}$ or about 5.0 V. Thus, with RESET at CMOS logic low and SET at CMOS logic high, the signal ECL_OUT will be at 5.0 V and the signal /ECL_OUT will be at 4.2 V.

Still referring to FIG. 5, if the voltage at the SET signal 102 is returned to a logic low, which means that both SET and RESET are now at logic low, the behavior of the circuit 100 is as follows. Since signal SET is low, NMOS transistor 124 will be off. However, NMOS transistor 130 has been turned on as described above, through the connection of its gate to $V_{DD}$ through resistor 118. Thus, transistor 130 conducts and the gate of NMOS transistor 126 is kept at a low, or nonconducting, voltage. This means that transistor 126 will continue to be off. Since the RESET signal 104 is still low, NMOS transistor 128 will also be off. The ECL_OUT signal at pad 106 will remain pulled high as before. The /ECL_OUT signal, which was previously at 4.2 V, will still be held to about that level through the current source conducting through transistor 130 and resistor 116. Thus, it is seen that when a logic high is momentarily applied to the SET signal while the RESET signal is low, and then subsequently when the logic high is removed from the SET signal and the SET signal kept low, the output of the circuit, ECL_OUT, is placed at a high voltage level and maintained there.

As can be readily seen from the schematic of FIG. 5, the RESET signal parallels the SET signal in terms of the configurations of transistors 124, 130, 126 and 128 and resistors 116 and 188. Therefore, the SET signal when applied with a high voltage will cause /ECL_OUT to be at 5 V and ECL_OUT to be at 4.2 V. This is because transistors 128 and 126 will be on, while transistors 124 and 130 will be off. When the RESET signal 104 is returned to a low voltage, ECL_OUT will still be low and /ECL_OUT will still be high since transistor 126 will be maintained on while transistor 130 will be off. This is analogous to the discussion above in regard to the SET signal. Thus, the RESET signal when applied with a high voltage causes ECL_OUT to go high, while ECL_OUT goes low. When the RESET signal is returned to a low voltage, /ECL_OUT and ECL_OUT maintain their voltages.

Figure 6:
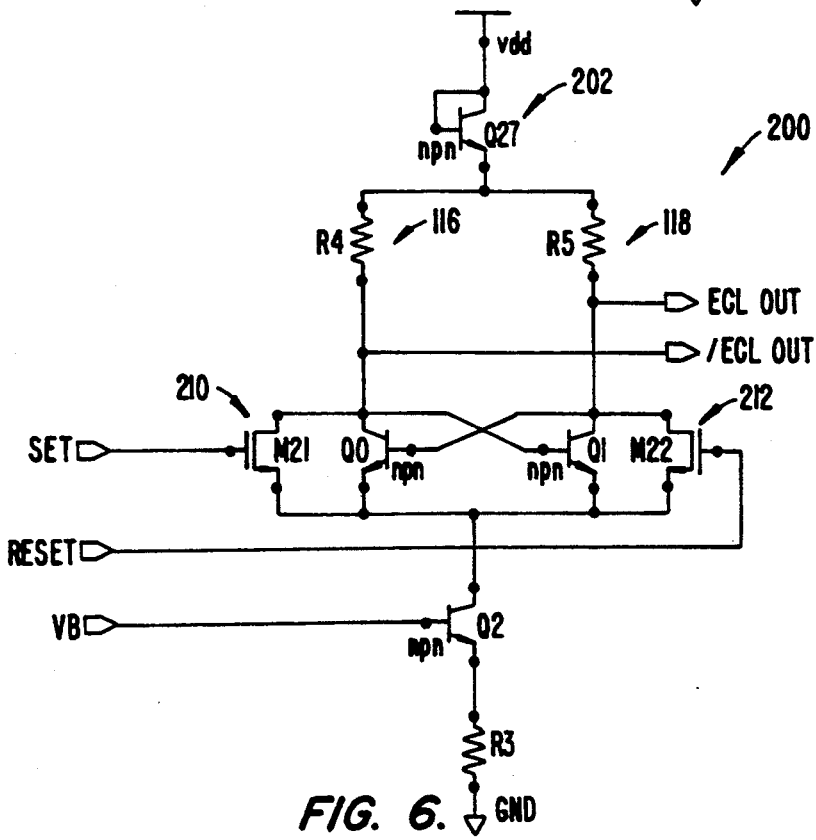
FIG. 6 is a schematic of the circuit of the present invention in a second embodiment.

FIG. 6 shows a schematic of a preferred embodiment of the present invention as actually implemented in a product, namely the integrated circuit device LMX2315, which is a phase locked loop frequency synthesizer. The difference in the circuit of FIG. 6 from the circuit of FIG. 5 is that transistor 202 has been included between the voltage source $V_{DD}$ and the resistor 116 and 118 and the NMOS transistors 130 and 126 are replaced by bipolar transistors. Note that identical components in FIGS. 5 and 6 have been given identical numbers. The purpose of the transistor 202 of FIG. 6 is to create a constant voltage drop between $V_{DD}$ and the ECL_OUT and /ECL_OUT signals so that ECL_OUT and /ECL_OUT will be approximately 0.8 V below their ranges in the circuit of FIG. 5.

In FIG. 6, the $V_{BE}$ value of transistor 202 will typically be about 0.7 V. The high ECL signal level will be $V_{DD}$ minus $V_{BE}$. As the current through either of resistors 116 or 118 is identical, the voltage drops across these resistors is also identical. Assuming a 0.8 V drop across each resistor in accordance with the discussion above, the voltage value for the high ECL level will be 5.0 V minus 0.7 V which equals 4.3 V and the low ECL voltage level will be 5.0 V minus 0.7 V minus 0.8 V which equals 3.5 V.

Thus, while the voltage differential in high to low ECL logic swings is still 0.8 V, the voltage levels have been shifted lower by approximately 0.7 V. This lowers the voltage required at the gates of NMOS transistors 210 and 212 to turn these NMOS transistors on.

Note that the ECL logic levels have been described as being between 5.0 and 4.2 V as in FIG. 5, or between 4.3 V and 3.5 V as in FIG. 6. The conversion to other ranges can be achieved by a simple level shifting circuit which is driven by the ECL_OUT and /ECL_OUT signals of the circuits of either of FIGS. 5 or 6 since the ECL signals already have the correct ECL differential of 0.8 V.

Note that changes may advantageously be made to component values of the circuit in FIG. 5 to achieve other workable embodiments.

For example, the resistor values of resistors 116 and 118 and the value of the current source generated by the voltage reference signal at pad 110, transistor 112, and resistor 114, can be varied so that the voltage drop across either of resistors 116 and 118 produces signal swings with a voltage differential other than 0.8 V. One useful change would be to cause a voltage differential swing of 0.4 V which is the so-called current mode logic (CML) standard. To adapt the circuit of FIG. 5 to the CML standard, all else being the same, the resistor values would be halved.

Other substitutions or minor modifications within the scope of the present invention will be readily apparent to one of ordinary skill in the art. For example, the current source of transistor 112, resistor 114, and voltage reference at pad 110, can be implemented by other means. Referring to FIG. 6, transistor 202 is essentially a diode and, as such, can be substituted with a diode or resistor with a value of 700 mV/current source value. The $V_{DD}$ voltage level could also be selected to comply with different input signal requirements for the SET and RESET signal voltage levels. Also, other transistor types, such as bipolar, can be substituted for the given transistor types, such as NMOS.

Even though the preferred embodiment has been fabricated on a single silicon substrate, the invention can readily be implemented on two or more discrete devices. Other substitutions or changes to the preferred embodiment are also possible.

In the foregoing specification, the invention has been described with reference to a specific exemplary embodiment thereof. It will, however, be evidenced that various modifications and changes may be made thereunto without departing from the broader spirit and scope of the invention as set for in the appended claims. Many applications of the present invention are readily envisioned. The specification and drawings are accordingly to be regarded in an illustrative rather than a restrictive sense and the invention is not intended to be limited except as indicated in the appended claims.

What is claimed is:

1. A latch circuit comprising:
    a first MOS transistor having a first terminal coupled to a first output node, a gate terminal coupled to a first latch input for performing a set function on said latch circuit, and a second terminal coupled to a first node;
    a second MOS transistor having a first terminal coupled to a second output node, a gate terminal coupled to a second latch input for performing a reset function on said latch circuit, and a second terminal coupled to said first node;
    a third MOS transistor having a first terminal coupled to said first output node, a second terminal coupled to said first node and a gate coupled to said second output node;
    a fourth MOS transistor having a first terminal coupled to said second output node, a second terminal coupled to said first node and a gate coupled to said first output node;
    a first resistor having a first terminal coupled to said first output node and a second terminal coupled to a first voltage;
    a second resistor having a first terminal coupled to said second output terminal and a second terminal coupled to said first voltage;
    a constant current source coupled between said first node and a second voltage; and
    where said first and second latch inputs operate in a first voltage range and where said first and second output nodes operate in a second voltage range.

2. The latch circuit of claim 1, further comprising voltage drop means coupled between said first voltage and first and second resistors for causing a constant voltage drop between said first voltage and said second terminals of said resistors.

3. The latch circuit of claim 2, wherein said constant voltage drop is about 0.7 volts.

4. The latch circuit of claim 3, wherein said voltage drop means is one of a diode or transistor configured as a diode.

5. The latch circuit of claim 1 wherein said first voltage is approximately equal to 5 volts.

6. The latch circuit of claim 1 wherein said second voltage is approximately equal to zero volts.

7. The latch circuit of claim 1, wherein said second voltage range has a voltage differential from a maximum voltage to a minimum voltage of about 0.8 volts.

* * * * *